(12) United States Patent
Ning

(10) Patent No.: US 8,158,520 B2
(45) Date of Patent: Apr. 17, 2012

(54) METHOD OF FORMING A VIA STRUCTURE DUAL DAMASCENE STRUCTURE FOR THE MANUFACTURE OF SEMICONDUCTOR INTEGRATED CIRCUIT DEVICES

(75) Inventor: Xian J. Ning, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 127 days.

(21) Appl. No.: 10/969,886

(22) Filed: Oct. 20, 2004

(65) Prior Publication Data

US 2006/0060971 A1 Mar. 23, 2006

(30) Foreign Application Priority Data

Sep. 21, 2004 (CN) .......................... 2004 1 0066664

(51) Int. Cl.
*H01L 21/4763* (2006.01)
(52) U.S. Cl. ........ 438/687; 438/638; 438/639; 438/633; 438/643; 257/E23.145
(58) Field of Classification Search .......... 438/637–638, 438/687, 643, 633
See application file for complete search history.

(56) References Cited

U.S. PATENT DOCUMENTS

| | | | | |
|---|---|---|---|---|
| 5,904,565 A * | 5/1999 | Nguyen et al. | ................ | 438/622 |
| 6,180,516 B1 * | 1/2001 | Hsu | ............................... | 438/638 |
| 6,753,260 B1 * | 6/2004 | Li et al. | ........................ | 438/700 |
| 7,335,990 B2 * | 2/2008 | Li et al. | ........................ | 257/751 |
| 2002/0123219 A1 * | 9/2002 | Laverty et al. | ................ | 438/637 |
| 2005/0184397 A1 * | 8/2005 | Gates et al. | .................... | 257/774 |
| 2006/0057835 A1 * | 3/2006 | Anderson et al. | ............. | 438/619 |

* cited by examiner

*Primary Examiner* — Thanh Nguyen
(74) *Attorney, Agent, or Firm* — Kilpatrick Townsend and Stockton LLP

(57) ABSTRACT

An integrated circuit device structure with a novel contact feature. The structure includes a substrate, a dielectric layer overlying the substrate, and a metal interconnect overlying the dielectric layer. A first interlayer dielectric layer is formed surrounding the metal interconnect. A second interlayer dielectric layer of a predetermined thickness is overlying the first interlayer dielectric layer. A trench opening of a first width is formed within an upper portion of the second interlayer dielectric layer. A first barrier layer is within and is overlying the trench opening of the first width. A contact opening of a second width is within a lower portion of the second interlayer dielectric layer. The second width is less than the first width. The lower portion of the second interlayer dielectric layer is coupled to the upper portion of the second interlayer dielectric layer within the predetermined thickness of the second interlayer dielectric. A second barrier layer is within and is overlying the opening of the contact opening and overlying the first barrier layer. A directional partially or completely removal of the second barrier forming a low contact resistance structure. A copper material is formed overlying the first barrier layer and the second barrier layer to substantially fill the contact opening and the trench within the second interlayer dielectric layer.

16 Claims, 5 Drawing Sheets

METHOD OF FORMING A VIA STRUCTURE DUAL DAMASCENE STRUCTURE FOR THE MANUFACTURE OF SEMICONDUCTOR INTEGRATED CIRCUIT DEVICES

CROSS-REFERENCES TO RELATED APPLICATIONS

This application claims priority to Chinese Patent Application No. 200410066664.4, filed Sep. 21, 2004, commonly assigned, incorporated by reference herein for all purposes.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed integrated circuits and their processing for the manufacture of semiconductor devices. More particularly, the invention provides a method and device for manufacturing a capacitor structure in a dual damascene metal interconnect for integrated circuits. Merely by way of example, the invention has been applied to a copper dual damascene structure for advanced integrated circuit devices such as mixed signal devices. But it would be recognized that the invention has a much broader range of applicability. For example, the invention can be applied to other types of metal layer such as tungsten, aluminum, and others.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of a technique that allows for smaller feature sizes is called the dual damascene structure. Such damascene structure is often made of copper material for multilevel interconnect designs of conventional integrated circuit devices. High-speed microprocessors have used such damascene structure, as well as others.

The dual damascene structure includes of a via and metal trench that are filled by metal in a single metallization process. Although such structure has many benefits, there are still limitations. For example, such damascene structure includes copper material itself that migrates and causes problems with adjacent dielectric materials. Accordingly, barrier metal layers should often be used to maintain the copper from contact with dielectric materials. Unfortunately, the barrier metal layer increases resistance within the damascene structure. That is, barrier metal layers between the via and lower metal contact increases resistance, which may be detrimental to the operation and the reliability of the integrated circuit. The damascene structure is also difficult to integrate with other device elements. These and other limitations are described throughout the present specification and more particularly below.

From the above, it is seen that an improved technique for processing semiconductor devices including interconnect structures is desired.

BRIEF SUMMARY OF THE INVENTION

According to the present invention, techniques for the manufacture of semiconductor devices are provided. More particularly, the invention provides a method and device for manufacturing a capacitor structure in a dual damascene metal interconnect for integrated circuits. Merely by way of example, the invention has been applied to a copper dual damascene structure for advanced integrated circuit devices such as mixed signal devices. But it would be recognized that the invention has a much broader range of applicability. For example, the invention can be applied to other types of metal layer such as tungsten, aluminum, and others.

In a specific embodiment, the invention provides an integrated circuit device structure with a novel via to metal contact feature. The structure includes a substrate (e.g., silicon wafer), a dielectric layer overlying the substrate, and a metal interconnect (e.g., copper, tungsten, aluminum) overlying the dielectric layer. A first interlayer dielectric layer is formed surrounding and co-planner with the metal interconnect, say metal 1. A second interlayer dielectric layer of a predetermined thickness is overlying the first interlayer dielectric layer and metal 1. A trench opening of a first width, say metal 2 trench, is formed within an upper portion of the second interlayer dielectric layer. A first barrier layer (e.g., SiN, TiSiN, TaSiN, Ta, Ti, Mo, W, TaN, WN, MoN, TiN, including combination of these) is within and is overlying the trench opening of the first width. The preferred thickness of the barrier ranges from 5 to 50 nm. The deposition technique can be chemical vapor deposition (CVD), physical vapor deposition (PVD), ion sputtering, electron beam evaporation, or the combination of them. A via opening of a second width, say via 1, is within a lower portion of the second interlayer dielectric layer, i.e. the bottom of metal 2 trench. The via 1 width is less than or equal to the metal 2 width. The lower portion of the second interlayer dielectric layer is coupled to the upper portion of the second interlayer dielectric layer within the predetermined thickness of the second interlayer dielectric. A second barrier layer which is thinner than that of the first barrier ranging from 3 nm to 30 nm is within and is overlying the opening of the vial opening and overlying the first barrier layer including within metal 2 trench. The barrier material can be SiN, TiSiN, TaSiN, Ta, Ti, Mo, W, TaN, WN, MoN, TiN, including combination of these. The deposition technique can be CVD, PVD, ion sputtering, electron beam evaporation, or the combination of them. The preferred thickness of the barrier ranges from 3 to 30 nm. A copper material is formed overlying the first barrier layer and the second barrier layer to substantially fill the via opening and the trench within the second interlayer dielectric layer. Preferably, the copper material includes a seed layer deposited by chemical vapor deposition and/or physical vapor deposition or other like techniques. Copper fill material is then electroplated overlying the seed layer. This embodiment can make the barrier thickness much thinner than the conventional method at the via bottom by adjusting the second barrier thickness and hence reduces the via to underneath metal contact resistance.

In an alternative specific embodiment, the invention provides a method for processing integrated circuit devices. The method includes providing a substrate and forming a dielectric layer overlying the substrate. The method also includes forming a metal interconnect overlying the dielectric layer and forming a first interlayer dielectric layer surrounding and co-planner with the metal interconnect. The method includes forming a second interlayer dielectric layer of a predetermined thickness overlying the first interlayer dielectric layer. A trench opening of a first width, say metal 2 trench, is formed within an upper portion of the second interlayer dielectric layer. A first barrier layer (e.g., SiN, TiSiN, TaSiN, Ta, Ti, Mo, W, TaN, WN, MoN, TiN, including combination of these) is formed within and is overlying the trench opening of the first width, metal 2 trench. The deposition technique can be CVD, PVD, ion sputtering, electron beam evaporation, or the combination of them with preferred thickness range from 5 to 50 nm. The method forms a vial opening of a second width with a lower portion of the second interlayer dielectric layer, the bottom of metal 2 trench, and through the trench opening. The vial width is less than or equal to the metal 2 trench width. The lower portion of the second interlayer dielectric layer is coupled to the upper portion of the second interlayer dielectric layer within the predetermined thickness of the second interlayer dielectric. The method forms a second barrier layer within and overlying the opening of the vial opening and overlying the first barrier layer including within metal 2 trench. The barrier material can be TiSiN, TaSiN, Ta, Ti, Mo, W, TaN, WN, MoN, TiN, including combination of these. The deposition technique can be CVD, PVD, ion sputtering, electron beam evaporation, or the combination of them. The preferred thickness of the barrier ranges from 5 to 50 nm. A reactive ion etch (RIE) process to partially remove the second barrier within vial is carried out. This step effectively reduces the barrier thickness at the bottom of via 1 where only the second barrier is applied. In the mean time the other parts of the structure are still covered at least by the first barrier and may be part of the second barrier. A copper material is formed overlying the first barrier layer and the second barrier layer on the sidewall of vias and trenches to substantially fill the via opening and the trench within the second interlayer dielectric layer. Preferably, the copper material includes a seed layer deposited by chemical vapor deposition and/or physical vapor deposition or other like techniques. Copper fill material is then electroplated overlying the seed layer. This embodiment makes the barrier thickness much thinner than the conventional method and hence reduces the via contact resistance.

In still an alternative specific embodiment, the invention provides method for processing integrated circuit devices. The method includes providing a substrate, which comprising a silicon bearing material. The method includes forming a first interlayer dielectric layer overlying the substrate and forming a metal interconnect within and co-planner with the first interlayer dielectric layer. The method also includes forming a second interlayer dielectric layer of a predetermined thickness overlying the first interlayer dielectric layer. A trench, say metal 2 trench, of a first width is formed within an upper portion to a surface region of the second interlayer dielectric layer. A first barrier layer (e.g., SiN, TiSiN, TaSiN, Ta, Ti, Mo, W, TaN, WN, MoN, TiN, including combination of these) is formed within and is overlying the trench of the first width. The method forms a vial opening of a with a lower portion of the second interlayer dielectric layer and through the metal 2 trench opening. The via 1 width is less than or equal to the metal 2 trench width. The lower portion of the second interlayer dielectric layer is coupled to the upper portion of the second interlayer dielectric layer within the predetermined thickness of the second interlayer dielectric. The method forms a second barrier layer within and overlying the opening of the via opening and overlying the first barrier layer including within metal 2 trench. The barrier material can be TiSiN, TaSiN, Ta, Ti, Mo, W, TaN, WN, MoN, TiN, including combination of these. The deposition technique can be CVD, PVD, ion sputtering, electron beam evaporation, or the combination of them. The preferred thickness of the barrier ranges from 5 to 50 nm The first barrier layer and the second barrier layer are substantially covering an interior portion of the trench and the second barrier covers the vial opening within the second interlayer dielectric layer. A un-isotropic RIE process to completely remove the second barrier within vial bottom is carried out. This step effectively remove the second barrier at the vial bottom, but remain the second barrier at the side wall of vial. The thickness of first and second barrier is selected so that the other parts of the structure are still fully covered at least by the first barrier after RIE. A copper material is formed overlying the first barrier layer and the remaining of second barrier layer on the sidewall of vias and trenches to substantially fill the contact opening and the trench within the second interlayer dielectric layer. The method planarizes an upper portion of the copper material. Preferably, the copper material includes a seed layer deposited by chemical vapor deposition and/or physical vapor deposition or other like techniques. Copper fill material is then electroplated overlying the seed layer. This embodiment makes copper to copper direct contact and hence greatly reduces the via contact resistance and improve the interconnect reliability.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention can be applied to a variety of applications such as memory, ASIC, microprocessor, and other devices. Preferably, the invention provides a way to manufacture an improved via structure with less resistance and much improved interconnect reliability performance as compared to conventional devices. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

Figure 1:
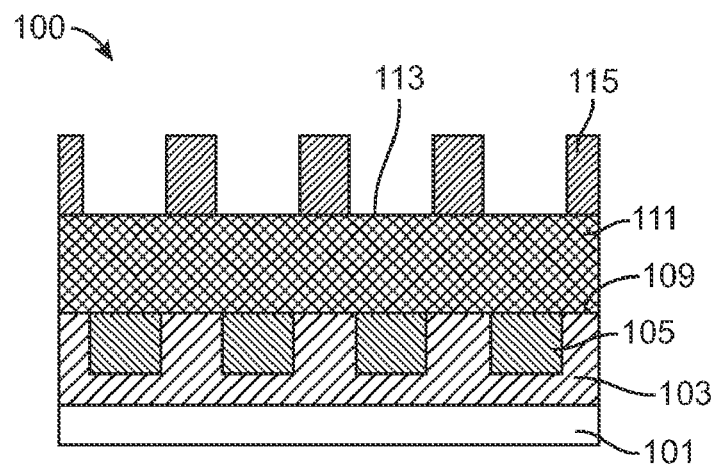
FIGS. 1 through 6 are simplified cross-sectional view diagrams illustrating a method of fabricating a dual damascene interconnect structure according to an embodiment of the present invention.

According to the present invention, techniques for the manufacture of semiconductor devices are provided. More particularly, the invention provides a method and device for manufacturing a low via to metal contact resistance in a trench first dual-damascene structure in metal interconnect for integrated circuits. Merely by way of example, the invention has been applied to a copper dual damascene structure for advanced integrated circuit devices such as mixed signal devices. But it would be recognized that the invention has a much broader range of applicability. For example, the invention can be applied to other types of metal layer such as tungsten, aluminum, and others.

A method for fabricating a trench first dual-damascene structure in an interconnect for integrated circuits is provided as follows:

1. Provide a semiconductor substrate, e.g., silicon wafer;
2. Form a dielectric layer overlying the semiconductor substrate;
3. Planarize the dielectric layer;
4. Pattern the dielectric layer to form trench regions;
5. Fill the trench regions with metal fill material;
6. Planarize the dielectric layer and patterned metal layer to expose an upper portion of the metal layer;
7. Form a capping layer overlying the planarized dielectric layer and patterned metal layer;
8. Form an interlayer dielectric layer overlying the capping layer;
9. Mask the interlayer dielectric layer;
10. Etch patterns within the dielectric layer to form trench structures within an upper portion of the interlayer dielectric layer;
11. Strip the photoresist mask;
12. Form a barrier metal layer within the trench structures;
13. Mask the trench structures with via patterns;
14. Etch contact openings through a lower portion of the barrier metal layer and through a portion of the capping layer within each of the trench structures to expose a portion of the metal layer;
15. Strip the photoresist mask; Note that this step can be done separately, i.e. to strip the resist before opening the capping layer in [32] and then further etch to open the capping layer to prevent underneath metal from exposing during resist stripping.
16. Form a barrier metal layer within the contact openings and overlying the exposed portion of the metal layer and overlying the barrier metal layer within the trench structures;
17. Perform RIE to reduce the barrier thickness at the via bottom by various degrees
18. Fill the contact opening and trench region with copper fill material;
19. Planarize the copper fill material; and
20. Perform other steps, as desired The above sequence of steps is used to form a via structure within a dual damascene metal interconnect. As shown, the method uses at least two barrier metal layer structures. The present method provides a resulting structure, which has improved contact resistance between the metal fill layer and underlying metal interconnect layer. Further details of this method are provided throughout the present specification and more particularly below.

FIGS. 1 through 6 are simplified cross-sectional view diagrams illustrating a method 100 of fabricating a dual damascene interconnect structure according to an embodiment of the present invention. These diagrams are merely an illustration, which should not unduly limit the scope of the claims herein. One of ordinary skill in the art would recognize many other variations, modifications, and alternatives. As shown, the method provides a semiconductor substrate 101, e.g., silicon wafer, silicon on insulator. In a specific embodiment, the method forms a dielectric layer 103 overlying the substrate. The dielectric layer is a suitable material such as silicon dioxide, silicon nitride, borophosphosilicate glass (BPSG), fluorine containing silicon glass (FSG), carbon containing silicon oxide, spin-on materials like flowable oxide (FOX), silk, a trade mark of Dow Chemical phosphosilicate glass (PSG), low K materials, and the like. The dielectric layer is patterned with trench regions, which will support interconnect structures. A metal layer 105 fills the trench regions. Preferably, the metal is copper, but it would be recognized that other metals such as tungsten, aluminum, poly-silicon, and gold can also be used. The metal is then planarized using chemical mechanical planarization (CMP) or the like. Alternatively, the method forms a dielectric layer overlying the semiconductor substrate. The method forms a metal overlying the dielectric layer. The metal layer is patterned and a dielectric layer is formed surrounding the patterned metal layer. The method planarizes the dielectric layer and patterned metal layer to expose an upper portion of the metal layer.

In a specific embodiment, a capping layer 109 is formed overlying the planarized dielectric layer and patterned metal layer. The capping layer is made of a suitable material that is often denser than the underlying dielectric layer. The capping layer is preferably silicon nitride, amorphous silicon carbide or the like. The silicon nitride or amorphous silicon carbide is deposited using a plasma enhanced CVD (PECVD) technique, although other techniques can also be used. The capping layer can also be made of multiple layers depending upon the application. The capping layer seals the underlying metal layer and dielectric layer, as shown.

Figure 2:
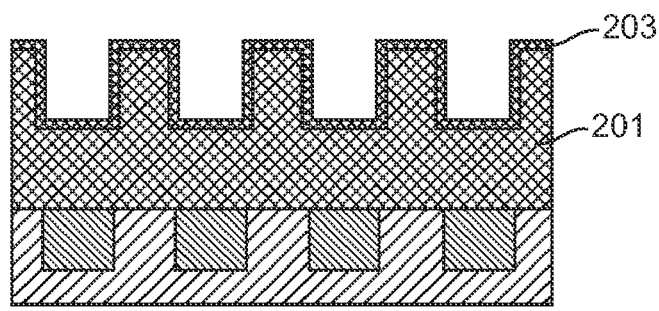

The method forms an interlayer dielectric layer 111 overlying the capping layer. The interlayer dielectric layer is made of a suitable material such as silicon dioxide, silicon nitride, fluorine containing silicon glass (FSG), carbon containing silicon oxide, spin-on materials like flowable oxide (FOX), silk, a trade mark of Dow Chemical borophosphosilicate glass (BPSG), phosphosilicate glass (PSG), low K materials, and the like. The interlayer dielectric includes an upper portion and a lower portion within a thickness of material. The upper portion includes a surface region, which can be planarized. A photo resist masking layer 115 is formed overlying the interlayer dielectric. The dielectric layer is patterned with trench regions, which will support interconnect structures, as shown in FIG. 2. The trench regions are formed within the upper portion of the thickness and couples to the surface of the interlayer dielectric layer. The trench regions include a predetermined width and depth according to a specific embodiment. The photo resist mask is stripped using ashing techniques following RIE that transfers photo pattern into interlayer dielectric.

The method forms a barrier metal layer 203 within the trench regions. The barrier metal layer lines the sides and lower portion 201 of the trench regions. Preferably, the barrier metal layer serves as a liner, which separates an overlying metal layer from the interlayer dielectric material. The barrier metal layer is made of a suitable material such as tantalum, tantalum nitride, titanium, titanium nitride, tungsten, titanium, SiN, TiSiN, TaSiN, Mo, W, WN, MoN, any combination of these to form layered structures, and the like. Preferably, the barrier metal layer is tantalum and tantalum nitride, which are deposited using a PVD process.

Figure 3:
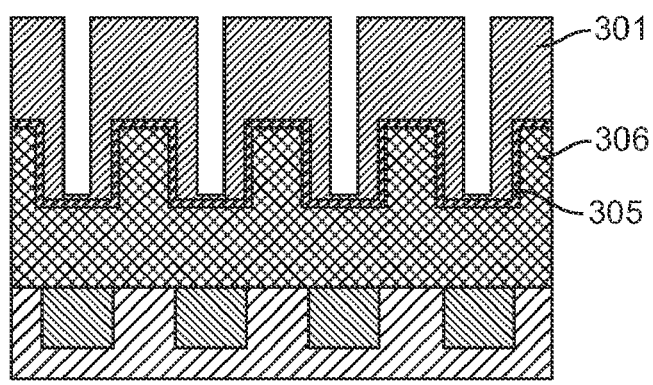

Referring to FIG. 3, the method forms a masking layer 301 overlying portions of the trench structure and interlayer dielectric layer. The masking layer exposes the lower portion 305 of the trench region. The masking layer covers edges of the trench region in a manner such that the exposed lower portion has an area that is smaller than or equal to the cross-section of the trench region. As shown, barrier metal layer is exposed. The exposed barrier metal layer will be etched to form a contact structure within the trench region.

Figure 4:
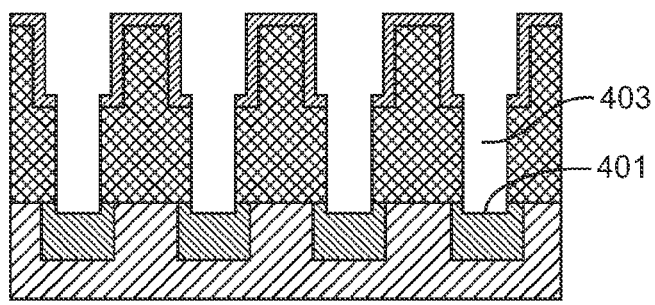

In a specific embodiment, the method etches the exposed barrier metal layer to form contact openings 403, as illustrated in FIG. 4. Each of the contact openings is formed through a lower portion of the interlayer dielectric layer, through the exposed barrier metal layer, and through a portion of the capping layer. Preferably, a portion of the metal layer 401 is exposed. Depending upon the embodiment, various etching techniques can be employed. For example, etching can occur using plasma etching techniques using a RIE with fluorine and/or chlorine bearing chemistry. Alternatively, etching can occur using ion-beam sputtering. The etching is preferably selective and stops upon exposure of the underlying metal layer. A single etching process or multi-step etching processes could be used to form the contact openings. Of course, the particular etching process depends upon a variety of factors according to specific embodiments. As shown, the method strips the photoresist mask before the next process.

Figure 5:
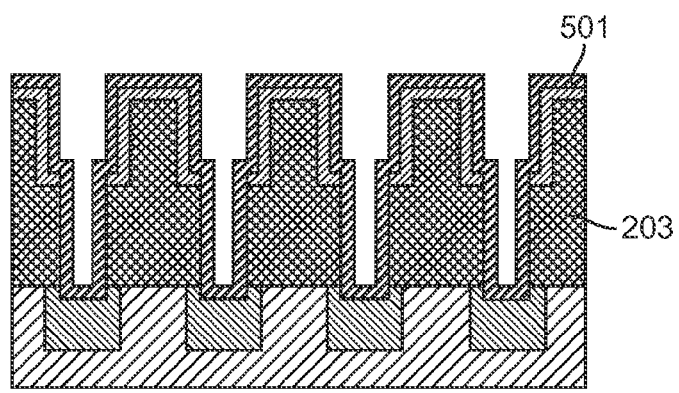

Referring to FIG. 5, the method forms a barrier metal layer 501 within the contact openings. The barrier metal layer is formed overlying the exposed portion of the metal layer, overlying the barrier metal layer on the upper portion of the dielectric layer in the trench structure, and overlying the contact opening in the lower portion of the interlayer dielectric layer. As shown, the contact opening includes a single or multi-barrier metal layer and the trench region includes multiple (e.g. two) barrier metal layers, which are stacked on each other. Preferably, the barrier metal layer is thin along the bottom region. The thin barrier metal layer will result in low a contact resistance between the lower and an upper metal layer. The thickness of this barrier varies depending on the specific application and embodiment given in previous sections. The barrier metal layer also covers the exposed region of the metal layer. Preferably, the barrier metal layer 501 and barrier metal layer 203 forms a liner within each of the trench and contact opening structures.

Figure 6:
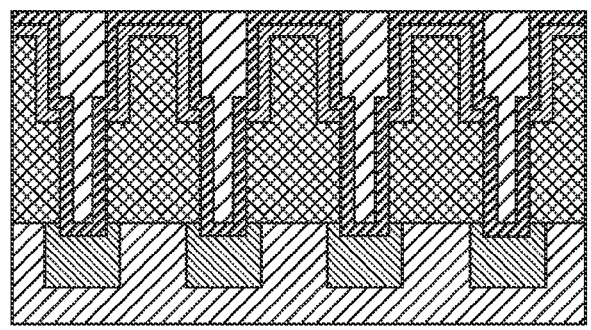
Figure 7:
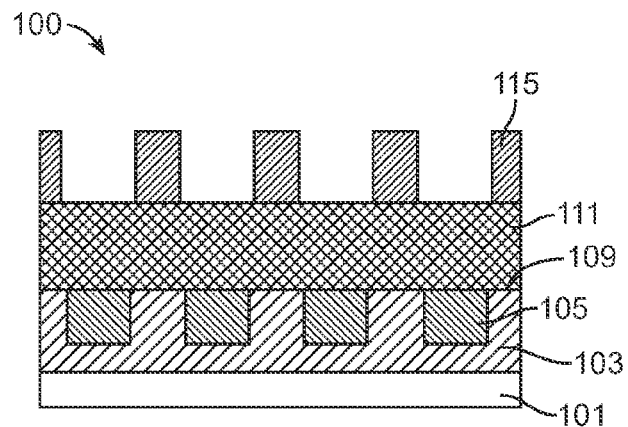
FIGS. 7 through 13 are simplified cross-sectional view diagrams illustrating a method of fabricating a dual damascene interconnect structure according to an alternative embodiment of the present invention

The method then fills the contact opening and trench region with a copper fill material, as illustrated by FIG. 6. Preferably, the metal is copper, but it would be recognized that other metals such as tungsten, aluminum, poly silicon, and gold can also be used. The copper fill material can be deposited using an electroplating process, deposition, and/or sputtering process. Preferably, the copper material includes a seed layer deposited by chemical vapor deposition and/or physical vapor deposition or other like techniques. Copper fill material is then electroplated overlying the seed layer. The metal is then planarized using chemical mechanical planarization or the like. Depending upon the embodiment, the method then performs other steps, such as cleaning or metal surface treatments as desired.

Although the above has been illustrated according to a specific embodiment, there can be other modifications, alternatives, and variations. For example, certain steps can be combined or separated. Other steps can be added without departing from the scope of the claims herein. It is also understood that the examples and embodiments described herein are for illustrative purposes only and that various modifications or changes in light thereof will be suggested to persons skilled in the art and are to be included within the spirit and purview of this application and scope of the appended claims.

An alternative method for fabricating a via structure in a dual damascene interconnect for integrated circuits is provided as follows:

1. Provide a semiconductor substrate, e.g., silicon wafer;
2. Form a dielectric layer overlying the semiconductor substrate;
3. Planarize the dielectric layer;
4. Pattern the dielectric layer to form trench regions;
5. Fill the trench regions with metal fill material;
6. Planarize the dielectric layer and patterned metal layer to expose an upper portion of the metal layer;
7. Form a capping layer overlying the planarized dielectric layer and patterned metal layer;
8. Form an interlayer dielectric layer overlying the capping layer;
9. Mask the interlayer dielectric layer;
10. Etch patterns within the dielectric layer to form trench structures within an upper portion of the interlayer dielectric layer;
11. Strip the photoresist mask;
12. Form a barrier metal layer within the trench structures and on the dielectric layer surface;
13. Pattern mask the contact (via) structures;
14. Etch contact openings through a barrier metal layer, a lower portion of the barrier metal layer and through a portion of the capping layer within each of the trench structures to expose a portion of the metal layer;
15. Strip the photoresist mask;
16. Form a barrier metal layer within the contact openings and overlying the exposed portion of the metal layer and overlying the barrier metal layer within the trench structures;
17. Strip the photoresist layer;
18. Etch lower portion of barrier metal layer to reduce the barrier metal thickness or to expose metal layer;
19. Fill the contact opening and trench region with copper fill material;
20. Planarize the copper fill material; and
21. Perform other steps, as desired The above sequence of steps is used to form a via structure within a dual damascene metal interconnect. As shown, the method uses at least two barrier metal layer structures. The present method provides a resulting structure, which has improved contact resistance between the metal fill layer and underlying metal interconnect layer. Preferably, the metal fill layer is in direct contact with the underlying metal layer. Further details of this method are provided throughout the present specification and more particularly below.

FIGS. 7 through 13 are simplified cross-sectional view diagrams illustrating a method 100 of fabricating a dual damascene interconnect structure according to an embodiment of the present invention. These diagrams are merely an illustration, which should not unduly limit the scope of the claims herein. One of ordinary skill in the art would recognize many other variations, modifications, and alternatives. Like reference numerals are used in these figures as others, but are not intended to be limiting. As shown, the method provides a semiconductor substrate 101, e.g., silicon wafer, silicon on insulator. In a specific embodiment, the method forms a dielectric layer 103 overlying the substrate. The dielectric layer is a suitable material such as silicon dioxide, silicon nitride, fluorine containing silicon glass (FSG), borophosphosilicate glass (BPSG), spin-on materials like flowable oxide (FOX), silk, carbon containing silicon oxides, phosphosilicate glass (PSG), low K materials, and the like. The dielectric layer is patterned with trench regions, which will support interconnect structures. A metal layer 105 fills the trench regions. Preferably, the metal is copper, but it would be recognized that other metals such as tungsten, aluminum, poly silicon, and gold can also be used. The metal is then planarized using chemical mechanical planarization or the like. Alternatively, the method forms a dielectric layer overlying the semiconductor substrate. The method forms a metal overlying the dielectric layer. The metal layer is patterned and a dielectric layer is formed surrounding the patterned metal layer. The method planarizes the dielectric layer and patterned metal layer to expose an upper portion of the metal layer.

In a specific embodiment, a capping layer 109 is formed overlying the planarized dielectric layer and patterned metal layer. The capping layer is made of a suitable material that is often denser than the underlying dielectric layer. The capping layer is preferably silicon nitride, amorphous silicon carbide or the like. The silicon nitride or amorphous silicon carbide is deposited using a CVD or PECVD technique, although other techniques can also be used. The capping layer can also be made of multiple layers depending upon the application. The capping layer seals the underlying metal layer and dielectric layer, as shown.

Figure 8:
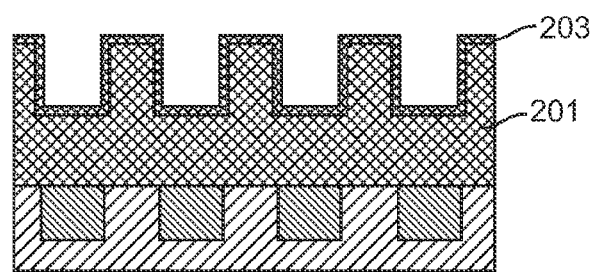

The method forms an interlayer dielectric layer 111 overlying the capping layer. The interlayer dielectric layer is made of a suitable material such as silicon dioxide, silicon nitride, fluorine containing silicon glass (FSG), spin-on materials like flowable oxide (FOX), silk, carbon containing silicon oxides, borophosphosilicate glass (BPSG), phosphosilicate glass (PSG), low K materials, and the like. The interlayer dielectric includes an upper portion and a lower portion within a thickness of material. The upper portion includes a surface region, which has been planarized. A photo resist masking layer 115 is formed overlying the interlayer dielectric. The dielectric layer is patterned with trench regions, which will support interconnect structures, as shown in FIG. 8. The trench regions are formed within the upper portion of the thickness and couples to the surface of the interlayer dielectric layer. The trench regions include a predetermined width and depth according to a specific embodiment. The photoresist mask is stripped using ashing techniques following a RIE process.

The method forms a barrier metal layer 203 within the trench regions. The barrier metal layer lines the sides and lower portion 201 of the trench regions. Preferably, the barrier metal layer serves as a liner, which separates an overlying metal layer from the interlayer dielectric material. The barrier metal layer is made of a suitable material such as SiN, TiSiN, TaSiN, Ta, Ti, Mo, W, TaN, WN, MoN, TiN, any combination of these to form sandwiched structures, and the like. Preferably, the barrier metal layer is tantalum and tantalum nitride, which are deposited using a PVD process. In one embodiment, the barrier metal layer comprises tantalum overlying tantalum nitride.

Figure 9:
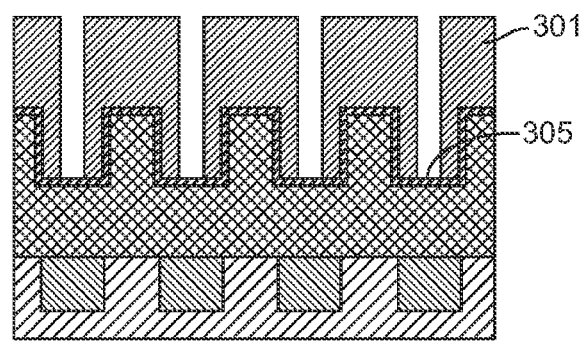

Referring to FIG. 9, the method forms a masking layer 301 overlying portions of the trench structure and interlayer dielectric layer. The masking layer exposes the lower portion 305 of the trench region. The masking layer covers edges of the trench region in a manner such that the exposed lower portion has an area that is smaller than the cross-section of the trench region. As shown, barrier metal layer is exposed. The exposed barrier metal layer will be etched to form a contact structure within the trench region.

Figure 10:
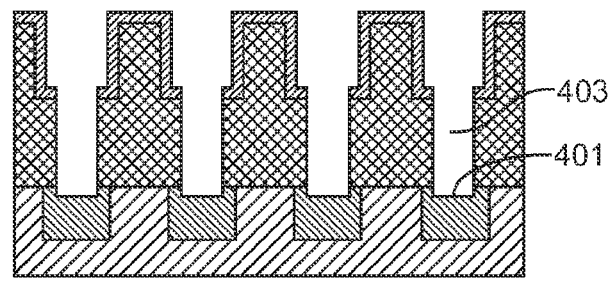

In a specific embodiment, the method etches the exposed barrier metal layer to form contact openings 403, as illustrated in FIG. 10. Each of the contact openings is formed through a lower portion of the interlayer dielectric layer, through the exposed barrier metal layer, and through a portion of the capping layer. Preferably, a portion of the metal layer 401 is exposed. Depending upon the embodiment, various etching techniques can be employed. For example, etching can occur using plasma etching techniques using a RIE with fluorine and or chlorine bearing chemistry. Alternatively, etching can occur using ion-beam sputtering. The etching is preferably selective and stops upon exposure of the underlying metal layer. A single etching process or multi-step etching processes could be used to form the contact openings. Of course, the particular etching process depends upon a variety of factors according to specific embodiments. As shown, the method strips the photoresist mask before the next process.

Figure 11:
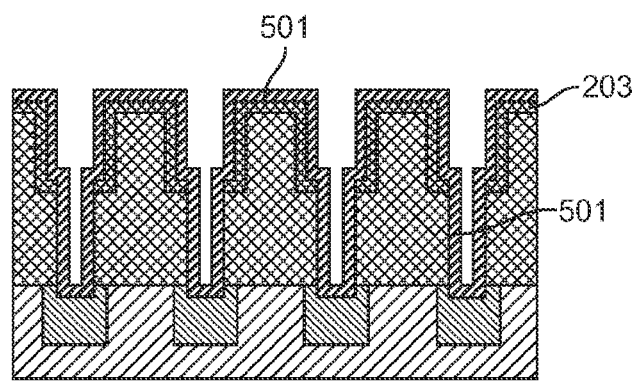

Referring to FIG. 11, the method forms a barrier metal layer 501 within the contact openings. The barrier metal layer is formed overlying the exposed portion of the metal layer, overlying the barrier metal layer on the upper portion of the dielectric layer in the trench structure, and overlying the contact opening in the lower portion of the interlayer dielectric layer. As shown, the contact opening includes a single or multi barrier metal layer and the trench region includes multiple (e.g. two) barrier metal layers, which are stacked on each other. The barrier metal layer also covers the exposed region of the metal layer. Preferably, the barrier metal layer 501 and barrier metal layer 203 forms a liner within each of the trench and contact opening structures.

Figure 12:
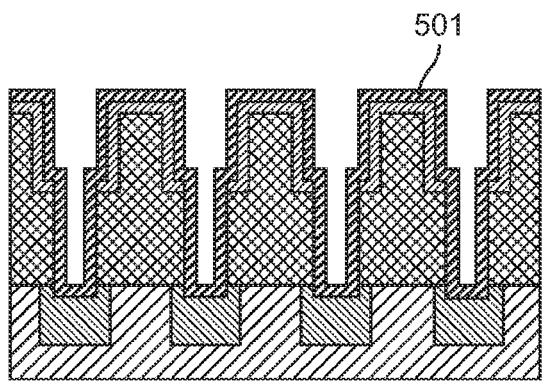
Figure 13:
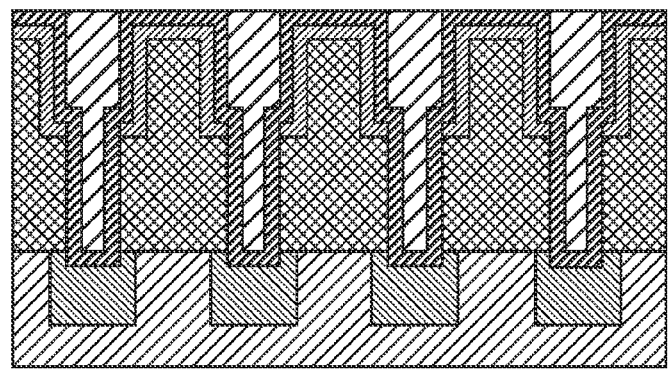

Referring to FIG. 12, the method removes a contact portion of the barrier metal layer to reduce the thickness of barrier 501 or to expose the metal layer depending on the application. Preferably, the method performs a blanket etching process without use of photomasking layers. Such blanket etching process is preferably directional. Directional etching includes, among others, reactive ion etching, plasma etching, ion-beam sputtering any combination of these, and the like. As shown, the lower portion of the barrier metal layer is exposed while the barrier metal layers on the sides of the contact opening and trench region remain intact. The method continues to the next process, which will be described in more detail below.

The method then fills the contact opening and trench region with a copper fill material, as illustrated by FIG. 6. Preferably, the metal is copper, but it would be recognized that other metals such as tungsten, aluminum, poly silicon, and gold can also be used. The copper fill material can be deposited using an electroplating process, deposition, and/or sputtering process. Preferably, the copper material includes a seed layer deposited by chemical vapor deposition and/or physical vapor deposition or other like techniques. Copper fill material is then electroplated overlying the seed layer. The metal is then planarized using chemical mechanical planarization or the like. Depending upon the embodiment, the method then performs other steps, such as cleaning or metal surface treatments as desired.

Although the above has been illustrated according to a specific embodiment, there can be other modifications, alternatives, and variations. For example, certain steps can be combined or separated. Other steps can be added without departing from the scope of the claims herein. It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for processing integrated circuit devices, the method comprising:
providing a substrate;
forming a dielectric layer directly overlying the substrate;
forming a metal interconnect in direct contact with the dielectric layer;
forming a first interlayer dielectric layer surrounding the metal interconnect;
forming a capping layer overlying the metal interconnect and the first interlayer dielectric layer;
forming a second interlayer dielectric layer of a predetermined thickness overlying the first interlayer dielectric layer, the second interlayer dielectric layer being made of a single dielectric layer;
forming a trench opening of a first width within an upper portion of the second interlayer dielectric layer, the upper portion being a portion of the predetermined thickness of the second interlayer dielectric layer and not through the predetermined thickness;
forming a first barrier layer lining a sidewall surface and a bottom portion of the trench opening of the first width, the first barrier layer comprising tantalum overlying tantalum nitride;
forming a contact opening of a second width within a lower portion of the second interlayer dielectric layer and through the trench opening, the second width being less than the first width, the lower portion of the second interlayer dielectric layer being coupled to the upper portion of the second interlayer dielectric layer within the predetermined thickness of the second interlayer dielectric layer, the contact opening exposing a portion of a surface of the metal interconnect;
forming a second barrier layer within and overlying the opening of the contact opening and overlying the first barrier layer lining the sidewall surface of the trench opening, the first barrier layer and the second barrier layer substantially overlying an interior portion of the trench, the second barrier layer overlying the contact opening including the exposed portion of the top surface of the metal interconnect and the exposed portion of the lower portion of the second interlayer dielectric layer;
thinning away a contact portion of the second barrier layer along the top surface of the metal interconnect using a blanket etching process; and
forming a copper material overlying the first barrier layer and the second barrier layer including the thinned contact portion of the second barrier layer along the top surface of the metal interconnect to substantially fill the contact opening and the trench within the second interlayer dielectric layer.

2. The method of claim 1 further comprising removing a bottom portion of the second barrier layer overlying a portion of the metal interconnect.

3. The method of claim 1 further comprising planarizing the copper fill material.

4. The method of claim 1 wherein the copper material in the trench and contact openings form a dual damascene structure.

5. The method of claim 1 wherein the second interlayer dielectric layer is selected from silicon dioxide, fluorinated silicon dioxide, or a low K dielectric material.

6. The method of claim 1 further comprising forming a capping layer overlying the metal interconnect.

7. A method for processing integrated circuit devices, the method comprising:
providing a substrate, the substrate comprising a silicon bearing material;
forming a first interlayer dielectric layer overlying the substrate;
forming a metal interconnect within the first interlayer dielectric layer, the metal interconnect comprising a copper material;
forming a second interlayer dielectric layer of a predetermined thickness overlying the first interlayer dielectric layer;
forming a trench of a first width within an upper portion to a surface region of the second interlayer dielectric layer;
forming a first barrier layer lining a sidewall surface and a bottom portion of the trench of the first width;
forming a contact opening of a second width with a lower portion of the second interlayer dielectric layer and through the trench, the second width being less than the first width, the lower portion of the second interlayer dielectric layer being coupled to the upper portion of the second interlayer dielectric layer within the predetermined thickness of the second interlayer dielectric, the contact opening exposing a portion of a top surface of the metal interconnect;
forming a second barrier layer within and overlying the opening of the contact opening and overlying the first barrier layer, the second barrier layer substantially covering the first barrier layer lining the sidewall surface of the trench, the contact opening within the second interlayer dielectric layer and the exposed portion of the top surface of the metal interconnect;
thinning away the portion of the top surface of the metal interconnect covered by the second barrier layer;
forming a copper material overlying the first barrier layer and the second barrier layer to substantially fill the contact opening and the trench including the thinned portion of the top surface of the metal interconnect within the second interlayer dielectric layer; and
planarizing an upper portion of the copper material.

8. The method of claim 7 wherein the planarizing uses chemical mechanical polishing.

9. The method of claim 7 further comprising removing a bottom portion of the second barrier layer overlying a portion of the metal interconnect to expose the metal interconnect layer.

10. The method of claim 7 wherein the contact opening and the trench are aligned along a common axis.

11. The method of claim 7 wherein the first barrier layer and the second barrier layer maintain the copper material within the trench and the contact opening.

12. The method of claim 7 wherein the copper material within the trench and the contact opening form a dual damascene structure.

13. The method of claim 7 wherein the first interlayer dielectric layer is planarized.

14. The method of claim 7 wherein the metal interconnect within the first interlayer dielectric layer includes a surface region that is substantially parallel with a surface of the first interlayer dielectric layer.

15. The method of claim 7 further comprising forming a capping layer overlying the metal interconnect.

16. The method of claim 7 wherein the second interlayer dielectric layer is selected from silicon dioxide, fluorinated silicon dioxide, a low K dielectric material, SiN, or carbon containing silicon oxide.

* * * * *